United States Patent
Mani et al.

(10) Patent No.: US 6,448,180 B2
(45) Date of Patent: Sep. 10, 2002

(54) DEPOSITION OF IN-SITU DOPED SEMICONDUCTOR FILM AND UNDOPED SEMICONDUCTOR FILM IN THE SAME REACTION CHAMBER

(75) Inventors: Balaraman Mani, Cupertino, CA (US); Bill Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 87 days.

(21) Appl. No.: 09/776,813

(22) Filed: Feb. 5, 2001

Related U.S. Application Data

(63) Continuation-in-part of application No. 09/521,591, filed on Mar. 9, 2000, now Pat. No. 6,410,434.

(51) Int. Cl.$^7$ .............................................. H01L 21/44
(52) U.S. Cl. ...................... 438/680; 438/765; 438/479; 438/482; 438/488
(58) Field of Search ................................. 438/764, 765, 438/479–482, 488, 778, 923, 657, 680, 684; 118/728

(56) References Cited

U.S. PATENT DOCUMENTS

| | | | | |
|---|---|---|---|---|
| 4,460,416 A | * | 7/1984 | Wonsowicz | 148/174 |
| 4,479,831 A | | 10/1984 | Sandow et al. | 148/1.5 |
| 4,504,521 A | * | 3/1985 | Widmer et al. | 427/85 |
| 4,696,833 A | * | 9/1987 | Monnig et al. | 437/225 |
| 5,250,463 A | * | 10/1993 | Mikata et al. | 437/109 |
| 5,532,183 A | | 7/1996 | Sugawara | 437/101 |
| 5,589,233 A | * | 12/1996 | Law et al. | 427/579 |
| 5,966,627 A | * | 10/1999 | Brady et al. | 438/542 |

OTHER PUBLICATIONS

Shye–Lin Wu, Chung–Len Lee, Tan Fu Lei, and Hue–Chen Chang, *Characteristics of Polysilicon Contacted Shallow Junction Diode Formed with a Stacked–Amorphous–Silicon Film*, IEEE Transactions on Electron Devices, vol. 40, No. 10, Oct. 1993, pp. 1797–1803.

(List continued on next page.)

*Primary Examiner*—Caridad Everhart
*Assistant Examiner*—Calvin Lee
(74) *Attorney, Agent, or Firm*—Monica H. Choi

(57) ABSTRACT

For depositing semiconductor films on a plurality of sets of semiconductor wafers, a first set of semiconductor wafers carried by a wafer boat are placed within a reaction chamber. An in-situ doped amorphous semiconductor film is deposited on the first set of semiconductor wafers while the first set of semiconductor wafers carried by the wafer boat are within the reaction chamber. The first set of semiconductor wafers carried by the wafer boat are removed from the reaction chamber, and the first set of semiconductor wafers are removed from the wafer boat. The wafer boat that is empty of any semiconductor wafers is placed back within the reaction chamber. A first undoped semiconductor film having a thickness in a range of from about 8,000 Å (angstroms) to about 12,000 Å (angstroms) is deposited on the wafer boat and on components of the reaction chamber. The wafer boat is then removed from the reaction chamber, and a second set of semiconductor wafers are loaded within the wafer boat. The wafer boat having the second set of semiconductor wafers loaded therein is placed within the reaction chamber. A second undoped semiconductor film is deposited on the second set of semiconductor wafers while the second set of semiconductor wafers carried by the wafer boat are within the reaction chamber. In this manner, the in-situ phosphorous doped amorphous silicon film is deposited on the first set of semiconductor wafers and the undoped polysilicon film is deposited on the second set of semiconductor wafers within the same reaction chamber to minimize cost and labor during integrated circuit manufacture.

12 Claims, 7 Drawing Sheets

OTHER PUBLICATIONS

Effiong Ibok and Shyam Garg, *A Characterization of the Effect of Deposition Temperature on Polysilicon Properties*, J. Electrochem. Soc., vol. 140, No. 10, Oct. 1993, pp. 2927–2937.

Markus Bohm, *Advances in Amorphous Silicon Based Thin Film Microelectronics*, Solid State Technology, Sep. 1988, pp. 125–131.

* cited by examiner

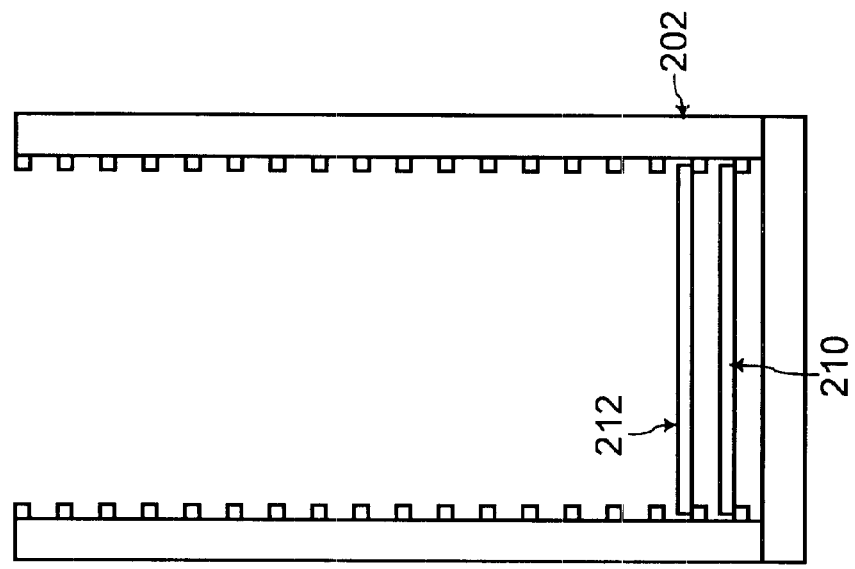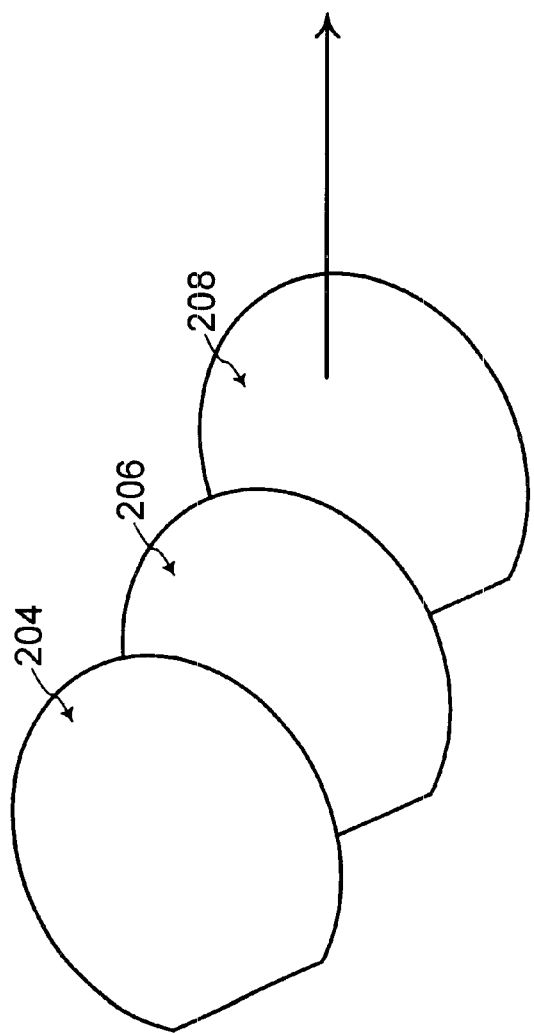
FIG. 2

DEPOSITION OF IN-SITU DOPED SEMICONDUCTOR FILM AND UNDOPED SEMICONDUCTOR FILM IN THE SAME REACTION CHAMBER

This is a continuation-in-part of an earlier filed patent application with Ser. No. 09/521,591 filed on Mar. 9, 2000, and issued as U.S. Pat. No. 6,410,434 for which priority is claimed. This earlier filed copending patent application with Ser. No. 09/521,591 is in its entirety incorporated herewith by reference.

TECHNICAL FIELD

The present invention relates generally to fabrication of integrated circuits, and more particularly, to a method for deposition of in-situ doped amorphous semiconductor film on a first set of semiconductor wafers and for deposition of undoped semiconductor film on a second set of semiconductor wafers within a same reaction chamber.

BACKGROUND OF THE INVENTION

Doped amorphous semiconductor film is used in integrated circuits for various purposes such as for forming a gate structure of a MOSFET (Metal Oxide Semiconductor Field Effect Transistor). The doped amorphous semiconductor film, such as doped amorphous silicon for example, in the prior art is typically formed by first forming a semiconductor film that is substantially undoped and then implanting dopant into the semiconductor film to enhance the conductivity of the semiconductor film. The dopant that has been implanted into the semiconductor film is then activated in a thermal anneal process to further enhance the conductivity of the semiconductor film from activation of the dopant within the semiconductor film, as known to one of ordinary skill in the art of integrate circuit fabrication.

However, such an implantation process is disadvantageous because at least three steps are used for forming the doped semiconductor film including formation of the undoped semiconductor film, implantation of the dopant into the semiconductor film, and then a thermal anneal process for activation of the dopant within the semiconductor film. Each additional step during integrated circuit fabrication introduces added cost and delay to the manufacture of integrated circuits.

A chemical reaction process such as a low pressure chemical vapor deposition process is used for formation of a doped semiconductor film with in-situ doping of the semiconductor film. With "in-situ" doping, dopant is incorporated into the semiconductor film simultaneously during deposition of the semiconductor film. Thus, a chemical reaction process for formation of the semiconductor film with "in-situ" doping avoids the three steps of the dopant implantation process.

Nevertheless, a chemical reaction process of the prior art is disadvantageous because defects may tend to form more easily in such a chemical reaction process than in an implantation process. Furthermore, electrical characteristics such as the sheet resistance of the semiconductor film is typically harder to control in a chemical reaction process than in an implantation process. In addition, the uniformity of electrical characteristics such as the sheet resistance of the semiconductor film across the semiconductor wafer is also typically harder to control in a chemical reaction process than in an implantation process.

For avoiding the three steps of the implantation process, an improved chemical reaction process is desired for formation of a semiconductor film with in-situ doping of the semiconductor film and with reduced defects and with predictable electrical characteristics such as controllable and uniform sheet resistance across the semiconductor wafer. Thus, the earlier filed copending patent application, with Ser. No. 09/521,591 describes a method and apparatus for depositing an in-situ doped amorphous semiconductor film within a reaction chamber to avoid the three steps of the implantation process.

After such an in-situ doped amorphous semiconductor film is deposited on a first set of semiconductor wafers in the reaction chamber as described in Ser. No. 09/521,591, a second set of semiconductor wafers may require deposition thereon of an undoped semiconductor film, such as polysilicon for example. In the prior art, a different reaction chamber is typically used for deposition of the undoped semiconductor film on the second set of semiconductor wafers. However, another reaction chamber adds cost to integrated circuit manufacture. In addition, another reaction chamber typically requires added labor for maintenance and monitoring of operation.

Thus, a process is desired for depositing in-situ doped semiconductor film, such as doped amorphous silicon for example, on a first set of semiconductor wafers and for depositing undoped semiconductor film, such as undoped polysilicon for example, on a second set of semiconductor wafers, within a same reaction chamber.

SUMMARY OF THE INVENTION

Accordingly, in a general aspect of the present invention, a coating of a first undoped semiconductor film is deposited on the wafer boat and on components of the reaction chamber after in-situ doped amorphous semiconductor film has been deposited on a first set of semiconductor wafers and before undoped semiconductor film is deposited on a second set of semiconductor wafers within the same reaction chamber.

In one embodiment of the present invention, in a method for depositing semiconductor films on a plurality of sets of semiconductor wafers, a first set of semiconductor wafers carried by a wafer boat are placed within a reaction chamber. An in-situ doped amorphous semiconductor film is deposited on the first set of semiconductor wafers while the first set of semiconductor wafers carried by the wafer boat are within the reaction chamber. The first set of semiconductor wafers carried by the wafer boat are removed from the reaction chamber, and the first set of semiconductor wafers are removed from the wafer boat. The wafer boat that is empty of any semiconductor wafers is placed back within the reaction chamber. A first undoped semiconductor film having a thickness in a range of from about 8,000 Å (angstroms) to about 12,000 Å (angstroms) is deposited on the wafer boat and on components of the reaction chamber. The wafer boat is then removed from the reaction chamber, and a second set of semiconductor wafers are loaded within the wafer boat. The wafer boat having the second set of semiconductor wafers loaded therein is placed within the reaction chamber. A second undoped semiconductor film is deposited on the second set of semiconductor wafers while the second set of semiconductor wafers carried by the wafer boat are within the reaction chamber.

In one embodiment of the present invention, for depositing the first undoped semiconductor film on the wafer boat and the components of the reaction chamber, the pressure within the reaction chamber is set to be about 0.19 Torr. The temperature within the reaction chamber is set to a predetermined temperature in a range of from about 600° Celsius to about 650° Celsius. A semiconductor film reactant flows through at least two gas inlets. Each gas inlet is disposed on a respective location of the reaction chamber near the wafer boat, and each gas inlet carries the semiconductor film reactant. The first undoped semiconductor film is formed on the wafer boat and the components of the reaction chamber from the semiconductor film reactant in a LPCVD (Low Pressure Chemical Vapor Deposition) process within the reaction chamber.

The present invention may be used to particular advantage when the in-situ doped amorphous semiconductor film deposited on the first set of semiconductor wafers is comprised of phosphorous doped amorphous silicon and the first undoped semiconductor film is comprised of undoped polysilicon with the semiconductor film reactant being comprised of silane ($SiH_4$). In that case, the second undoped semiconductor film deposited on the second set of semiconductor wafers may also be comprised of undoped polysilicon film.

In this manner, the relatively thick first undoped semiconductor film encapsulates any dopant remaining from the prior deposition of the in-situ doped amorphous semiconductor film before the second set of semiconductor wafers are placed into the wafer boat and the reaction chamber for deposition of the second undoped semiconductor film on the second set of semiconductor wafers. The in-situ phosphorous doped amorphous silicon film is deposited on the first set of semiconductor wafers and the undoped polysilicon film is deposited on the second set of semiconductor wafers within the same reaction chamber to minimize cost and labor during integrated circuit manufacture.

Furthermore, for reducing defects on the semiconductor wafers, a vacuum suction may be applied through the at least two gas inlets and nitrogen ($N_2$) gas may be purged through the at least two gas inlets, once before deposition of the coating of the first undoped semiconductor film on the wafer boat and on the components of the reaction chamber, and alternatingly at least three times after deposition of the coating of the first undoped semiconductor film on the wafer boat and on the components of the reaction chamber. This purging reduces the defects by reducing the number of contaminant particles within the reaction chamber.

These and other features and advantages of the present invention will be better understood by considering the following detailed description of the invention which is presented with the attached drawings.

BRIEF DESCRIPTION OF THE DRAWINGS

FIG. 2 shows a wafer boat for holding the plurality of semiconductor wafers within the reaction chamber of FIG. 1;

The figures referred to herein are drawn for clarity of illustration and are not necessarily drawn to scale. Elements having the same reference number in FIGS. 1, 2, 3, 4, 5, 6, and 7 refer to elements having similar structure and function.

DETAILED DESCRIPTION

Figure 1:
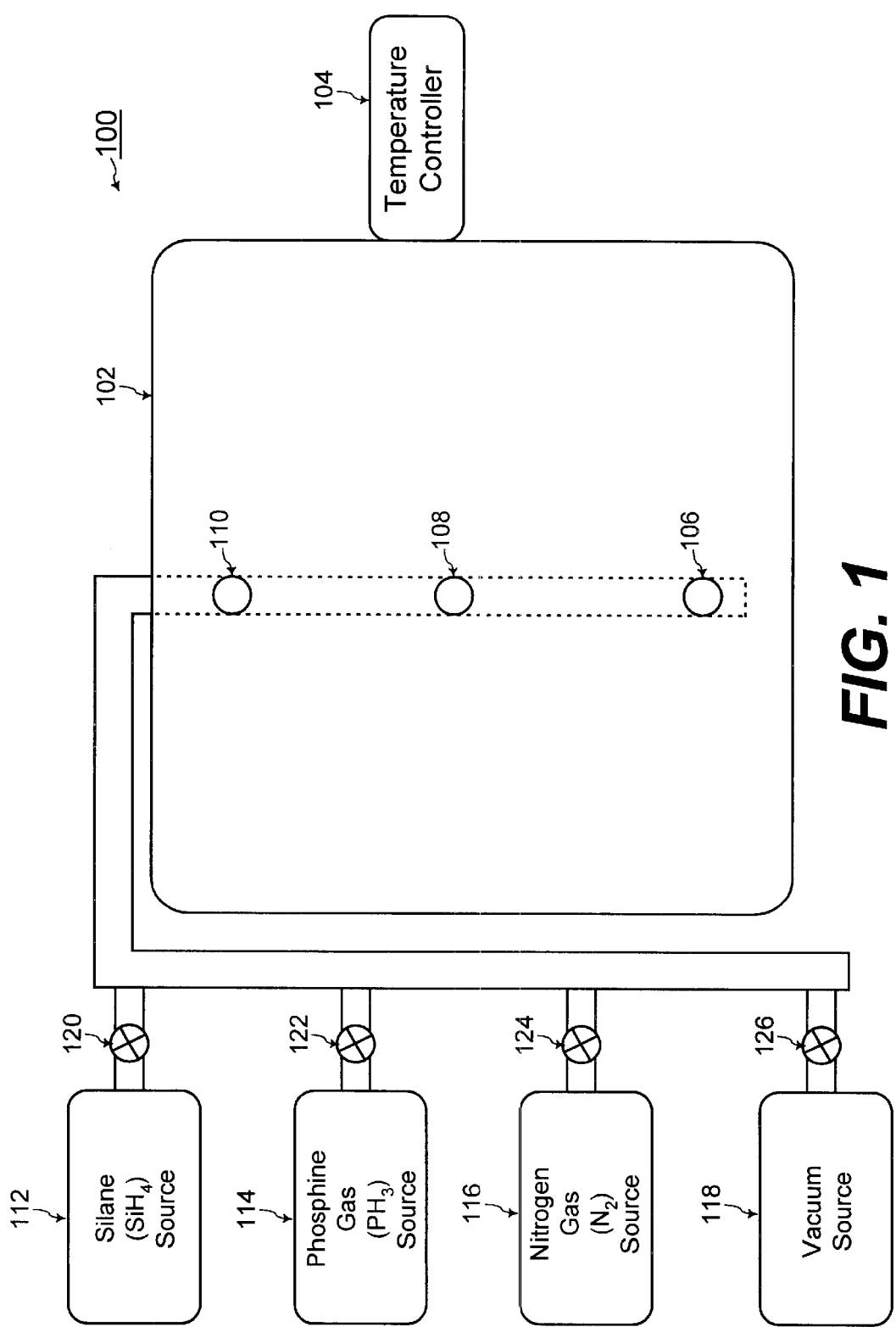
FIG. 1 shows components of an apparatus including a reaction chamber for depositing in-situ doped amorphous semiconductor film on a first set of semiconductor wafers and undoped semiconductor film on a second set of semiconductor wafers within the same reaction chamber, according to an embodiment of the present invention.

Referring to FIG. 1, an apparatus 100 with a reaction chamber 102 includes components for deposition of in-situ doped amorphous silicon film as described in earlier filed copending patent application, with Ser. No. 09/521,591. According to an aspect of the present invention, the reaction chamber 102 of the apparatus 100 is used for depositing both an in-situ doped amorphous semiconductor film on a first set of semiconductor wafers and an undoped semiconductor film on a second set of semiconductor wafers within the same reaction chamber 102.

Referring to FIG. 1, a temperature controller 104 is coupled to the reaction chamber 102 for setting the temperature within the reaction chamber 102 to a predetermined temperature. In one embodiment of the present invention, each of three gas inlets are disposed at a respective location of a wall of the reaction chamber 102. In the embodiment of the present invention as illustrated in FIG. 1, a first gas inlet 106 is disposed at a lower position, a second gas inlet 108 is disposed at a middle position, and a third gas inlet 110 is disposed at an upper position along a vertical dimension of a wall of the reaction chamber 102.

Further referring to FIG. 1, each of the gas inlets 106, 108, and 110 are coupled to a semiconductor film reactant source 112 (which in the embodiment of FIG. 1 is a silane ($SiH_4$) source) and to a dopant reactant source 114 (which in the embodiment of FIG. 1 is a phosphine ($PH_3$) source). The semiconductor film reactant source 112 provides a semiconductor film reactant which in the embodiment of FIG. 1 is silane ($SiH_4$), and the dopant reactant source 114 provides a dopant reactant which in the embodiment of FIG. 1 is phosphine ($PH_3$).

Furthermore, each of the gas inlets 106, 108, and 110 is also coupled to a nitrogen gas ($N_2$) source 116 and to a vacuum source 118. The semiconductor film reactant source 112 is coupled to a first valve 120 for controlling flow of the semiconductor film reactant through the gas inlets 106, 108, and 110. The dopant reactant source 114 is coupled to a second valve 122 for controlling flow of the dopant reactant through the gas inlets 106, 108, and 110. The nitrogen gas ($N_2$) source 116 is coupled to a third valve 124 for controlling flow of the nitrogen gas ($N_2$) through the gas inlets 106, 108, and 110. The vacuum source 118 is coupled to a fourth valve 126 for controlling application of vacuum suction through the gas inlets 106, 108, and 110.

Referring to FIG. 2, a plurality of wafers are loaded within a wafer boat 202 for placement into the reaction chamber 102. Referring to FIG. 2, a plurality of wafers including a first semiconductor wafer 204, a second semiconductor wafer 206, and a third semiconductor wafer 208 are to be placed in the wafer boat 202. The wafer boat 202 is typically comprised of quartz and carries each of a plurality of semiconductor wafers within a respective slot, as known to one of ordinary skill in the art of integrated circuit fabrication. In one embodiment of the wafer boat 202 of FIG. 2, a plurality of semiconductor wafers are stacked vertically with the surface of a semiconductor wafer having integrated circuits fabricated thereon facing upward. Referring to FIG. 2, a fourth semiconductor wafer 210 is placed into a first slot of the wafer boat 202, and a fifth semiconductor wafer 212 is placed into a second slot of the wafer boat 202, for example.

Figure 3:
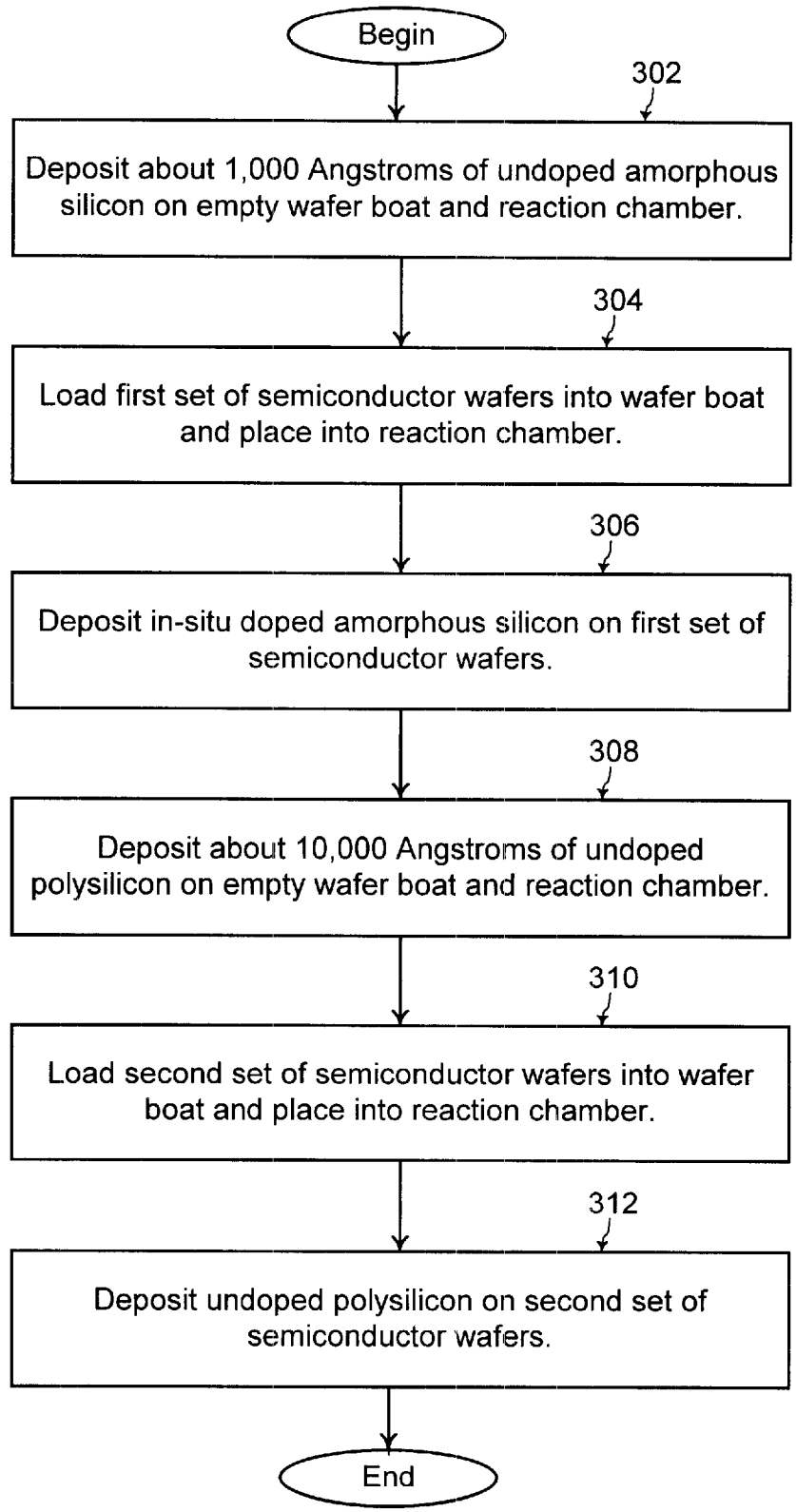
FIG. 3 shows a flowchart of the steps for deposition of an in-situ doped amorphous silicon film on a first set of semiconductor wafers and for deposition of an undoped polysilicon film on a second set of semiconductor wafers, within the same reaction chamber according to an embodiment of the present invention.

The operation of the apparatus 100 for deposition of the in-situ doped amorphous semiconductor film on a first set of semiconductor wafers and for deposition of undoped semiconductor film on a second set of semiconductor wafers within the same reaction chamber 102 is described in reference to the steps of the flowchart of FIG. 3.

Figure 4:
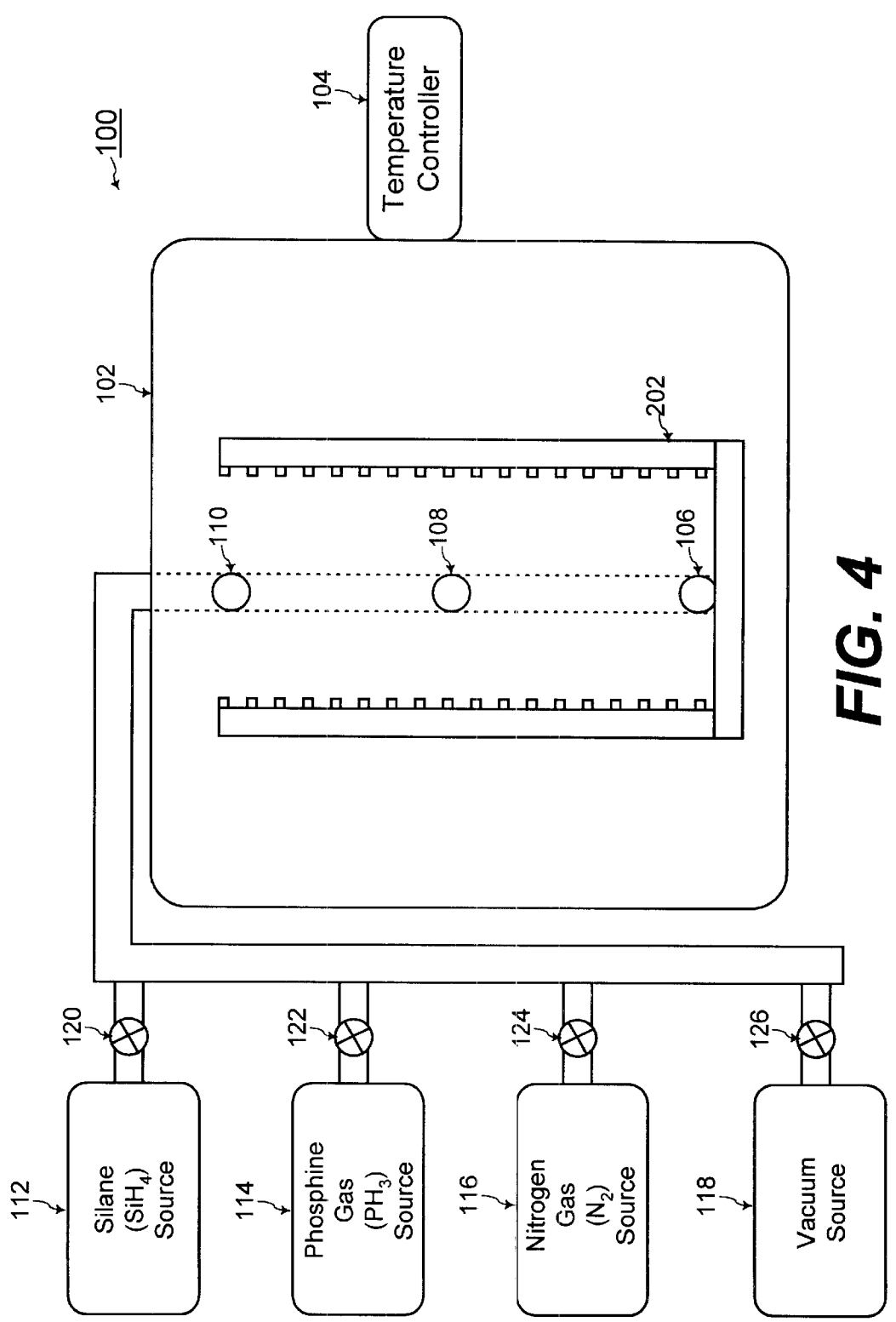
FIG. 4 illustrates placement of the empty wafer boat of FIG. 2 within the reaction chamber of FIG. 1 for deposition of a thin coating of undoped amorphous silicon on the empty wafer boat and components of the reaction chamber for reducing defects on the semiconductor wafers before deposition of the in-situ doped amorphous semiconductor film, according to an embodiment of the present invention.

Operation of the apparatus 100 for deposition of the in-situ doped amorphous semiconductor film as stated in earlier filed copending patent application, with Ser. No. 09/521,591 is now described. Referring to FIG. 4, the wafer boat 202 that is empty without any semiconductor wafer loaded therein is placed into the reaction chamber 102. The first valve 120 is controlled such that silane ($SiH_4$) flows through the gas inlets 106, 108, and 110 with a flow rate of about 2000 sccm (standard cubic centimeters per minute). Valve technology for controlling the flow rate through the valve is known to one of ordinary skill in the art.

The temperature within the reaction chamber 102 is controlled to be set at a predetermined temperature in a range of from about 500° Celsius to about 550° Celsius (preferably about 530° Celsius according to one embodiment of the present invention) by the temperature controller 104. The pressure within the reaction chamber is controlled to be less than about 1.0 Torr (preferably about 0.4 Torr according to one embodiment of the present invention), by mechanisms that are known to one of ordinary skill in the art of integrated circuit fabrication.

With such conditions, a layer of undoped amorphous silicon film is initially deposited on the empty wafer boat 202 and on components of the reaction chamber 102 located within the reaction chamber 102 (step 302 of FIG. 3). In one embodiment of the present invention, about 1000 Å (angstroms) of undoped amorphous silicon film coats the empty wafer boat 202 and the components within the reaction chamber 102. Deposition of the undoped amorphous silicon film on the empty wafer boat 202 and on the components within the reaction chamber 102 before deposition of the doped amorphous semiconductor film on the semiconductor wafers is advantageous for reducing defects during subsequent deposition of the doped amorphous semiconductor film on the semiconductor wafers.

Figure 5:
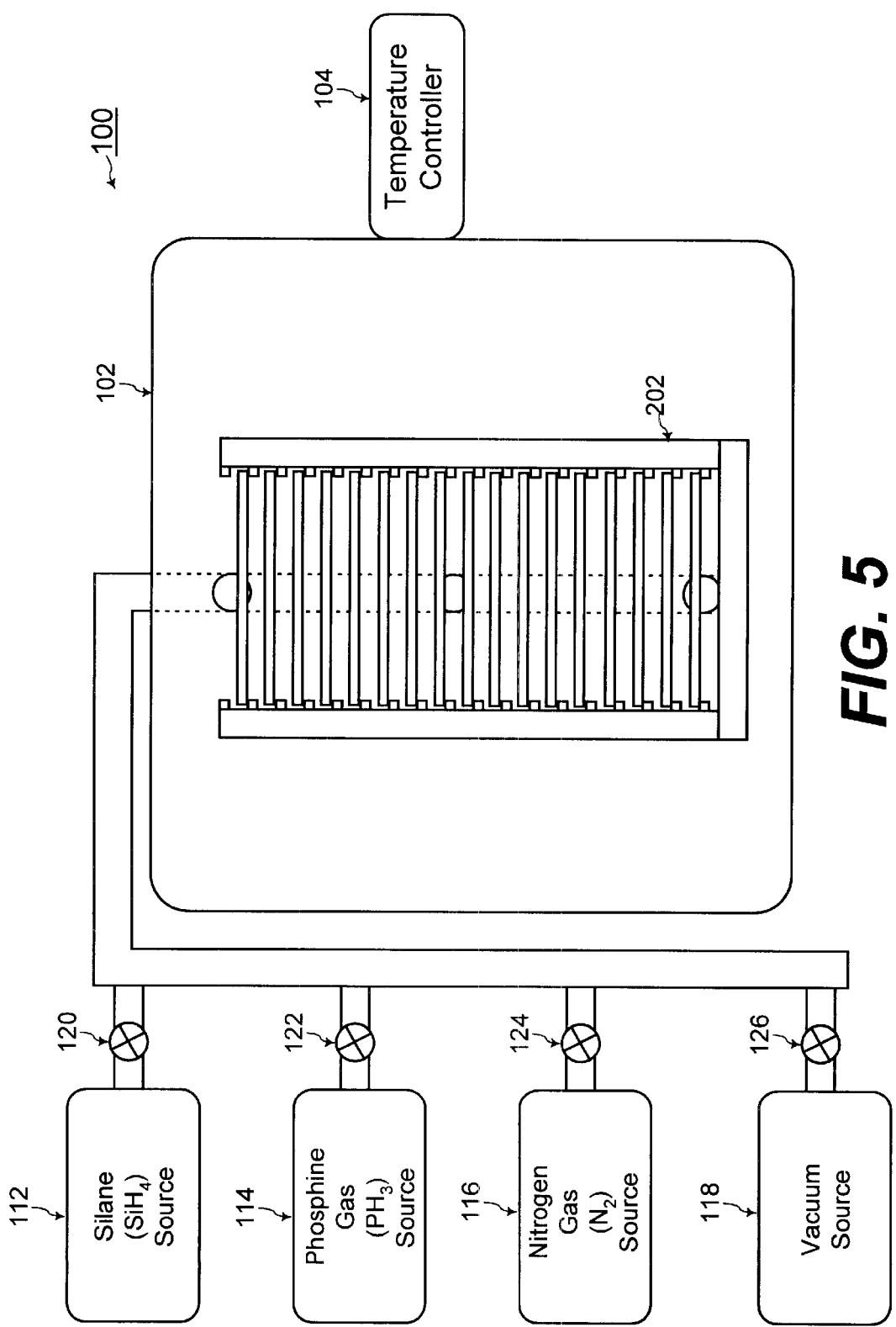
FIG. 5 illustrates placement of the wafer boat of FIG. 2 having a first set of semiconductor wafers loaded therein within the reaction chamber of FIG. 1 for deposition of the in-situ doped amorphous semiconductor film on the first set of semiconductor wafers, according to an embodiment of the present invention.

Referring to FIG. 5, for deposition of the in-situ doped amorphous semiconductor film on the semiconductor wafers, the wafer boat 202 having undoped silicon film coated thereon is loaded with a first set of semiconductor wafers (step 304 of FIG. 3). Referring to FIG. 5, the wafer boat 202 having the first set of semiconductor wafers loaded therein is then placed into the reaction chamber 102 (step 304 of FIG. 3). The first set of semiconductor wafers are stacked within the wafer boat 202 along the vertical dimension of the linear alignment of the gas inlets 106, 108, and 110 such that the plurality of semiconductor wafers are substantially near the gas inlets 106, 108, and 110.

After placement of the wafer boat 202 having the first set of semiconductor wafers loaded therein within the reaction chamber 102, the valves 124 and 126 are controlled such that a vacuum suction from the vacuum source 118 is applied on the gas inlets 106, 108, and 110 and such that nitrogen gas ($N_2$) is purged through the gas inlets 106, 108, and 110 alternatingly. Such alternating application of the vacuum suction and the nitrogen gas ($N_2$) purge through the gas inlets 106, 108, and 110 is repeated at least three times for reducing the number of contaminant particles within the reaction chamber 102.

After such repeated application of the vacuum suction and the nitrogen gas ($N_2$) purge through the gas inlets 106, 108, and 110, the valves 120 and 122 are controlled such that the semiconductor reactant source (i.e. silane ($SiH_4$) in FIG. 5) and the dopant reactant source (i.e. phosphine ($PH_3$) in FIG. 5) both flow through each of the gas inlets 106, 108, and 110. In one embodiment of the present invention, silane flows through each of the gas inlets 106, 108, and 110 with a flow rate of 2000 sccm (standard cubic centimeters per minute). Furthermore, in one embodiment of the present invention, phosphine flows through the first gas inlet 106 with a flow rate of 2 sccm (standard cubic centimeter per minute), through the second gas inlet 108 with a flow rate of 2.8 sccm (standard cubic centimeter per minute), and through the third gas inlet 110 with a flow rate of 20 sccm (standard cubic centimeter per minute).

The temperature within the reaction chamber 102 is controlled to be set at a predetermined temperature in a range of from about 500° Celsius to about 550° Celsius (preferably about 530° Celsius according to one embodiment of the present invention) by the temperature controller 104. The pressure within the reaction chamber 102 is controlled to be less than about 1.0 Torr (preferably about 0.4 Torr according to one embodiment of the present invention) by mechanisms that are known in to one of ordinary skill in the art of integrated circuit fabrication.

With such conditions, a layer of in-situ doped amorphous silicon film is formed from the semiconductor film reactant (i.e. silane ($SiH_4$) in FIG. 5) with in-situ phosphorous doping from the dopant reactant (i.e. phosphine ($PH_3$) in FIG. 5) on the first set of semiconductor wafers within the wafer boat 202 in a LPCVD (Low Pressure Chemical Vapor Deposition) process (step 306 of FIG. 3). For example, with a deposition time of about 9 minutes, approximately 900 Å (angstroms) of phosphorous doped amorphous silicon film is deposited on the first set of semiconductor wafers within the wafer boat 202 according to one embodiment of the present invention.

In this manner, referring to FIG. 5, because of the positioning of the three gas inlets 106, 108, and 110 along the vertical dimension of the stacked configuration of the plurality of semiconductor wafers within the wafer boat 202, the doped amorphous silicon film deposited on the first set of semiconductor wafers within the wafer boat 202 has more uniform sheet resistance across a whole wafer and from wafer to wafer. In addition, the concentration of the dopant reactant from the dopant reactant source 114 may be controlled for predictably controlling the sheet resistance of the doped amorphous silicon film with the positioning of the three gas inlets 106, 108, and 110 along the vertical dimension of the stacked configuration of the plurality of semiconductor wafers within the wafer boat 202. For example, when the concentration of phosphine ($PH_3$) is about 1% (by volume) within a helium carrier, with the flow rates of the silane and phosphine described herein, the concentration of the phosphorous within the doped amorphous silicon film is about $1 \times 10^{20}$ phosphorous atoms per centimeters squared.

For the example phosphorous doped amorphous silicon film having 900 Å (angstroms) thickness and phosphorous concentration of about $1 \times 10^{20}$ phosphorous atoms per centimeters squared, the sheet resistance of such a doped amorphous silicon film is in a range of from about 580 to about 620 ohms per square across a semiconductor wafer and from semiconductor wafer to semiconductor wafer.

In addition, during the LPCVD (Low Pressure Chemical Vapor Deposition) of the present invention, phosphorous is in-situ doped into the amorphous silicon film such that additional fabrication steps of a dopant implantation process are avoided. Elimination of the additional fabrication steps results in savings of cost and delay during fabrication of integrated circuits on the semiconductor wafers.

Referring back to FIG. 5, after deposition of the in-situ doped amorphous semiconductor film on the first set of semiconductor wafers within the wafer boat 202, the valves 120 and 122 are controlled to stop flow of the semiconductor film reactant (i.e. silane ($SiH_4$) in FIG. 5) and the dopant reactant (i.e. phosphine ($PH_3$) in FIG. 5) through the gas inlets 106, 108, and 110. The valves 124 and 126 are then controlled such that a vacuum suction from the vacuum source 118 is applied on the gas inlets 106, 108, and 110 and such that nitrogen gas ($N_2$) is purged through the gas inlets 106, 108, and 110 alternatingly. Such alternating application of the vacuum suction and the nitrogen gas ($N_2$) purge through the gas inlets 106, 108, and 110 is repeated at least three times for reducing the number of contaminant particles within the reaction chamber 102. In addition, for further reducing the number of contaminant particles within the reaction chamber 102, nitrogen gas ($N_2$) from the nitrogen gas ($N_2$) source 116 is purged through the gas inlets 106, 108, and 110 when the reaction chamber 102 is idle for at least 4 hours.

In this manner, by depositing the undoped silicon film on the wafer boat 202 and the components of the reaction chamber 102 within the reaction chamber 102 and with the repeated application of the vacuum suction and the nitrogen gas ($N_2$) purge through the gas inlets 106, 108, and 110, defects on the doped amorphous semiconductor film are minimized with the present invention. The defect density decreased to approximately 30 defects per semiconductor wafer with the present invention from approximately 300 defects per semiconductor wafer with the prior art chemical process for deposition of the doped amorphous silicon film.

The present invention may be used to particular advantage when the doped amorphous silicon film is used as a gate structure of a MOSFET (Metal Oxide Semiconductor Field Effect Transistor) during fabrication of integrated circuits.

The doped amorphous semiconductor film formed according to the LPCVD (Low Pressure Chemical Vapor Deposition) process of the present invention avoids the extraneous steps of a dopant implantation process and has minimized defects and predictable electrical characteristics.

Referring to FIG. 5, after deposition of the in-situ doped amorphous silicon film on the first set of semiconductor wafers as described herein, the wafer boat 202 having the first set of semiconductor wafers is removed from the reaction chamber 102. The first set of semiconductor wafers is then removed from the wafer boat 202. Processes for removal of the wafer boat 202 from the reaction chamber 102 and for removal of the first set of semiconductor wafers from the wafer boat 202 are known to one of ordinary a skill in the art of integrated circuit fabrication.

Figure 6:
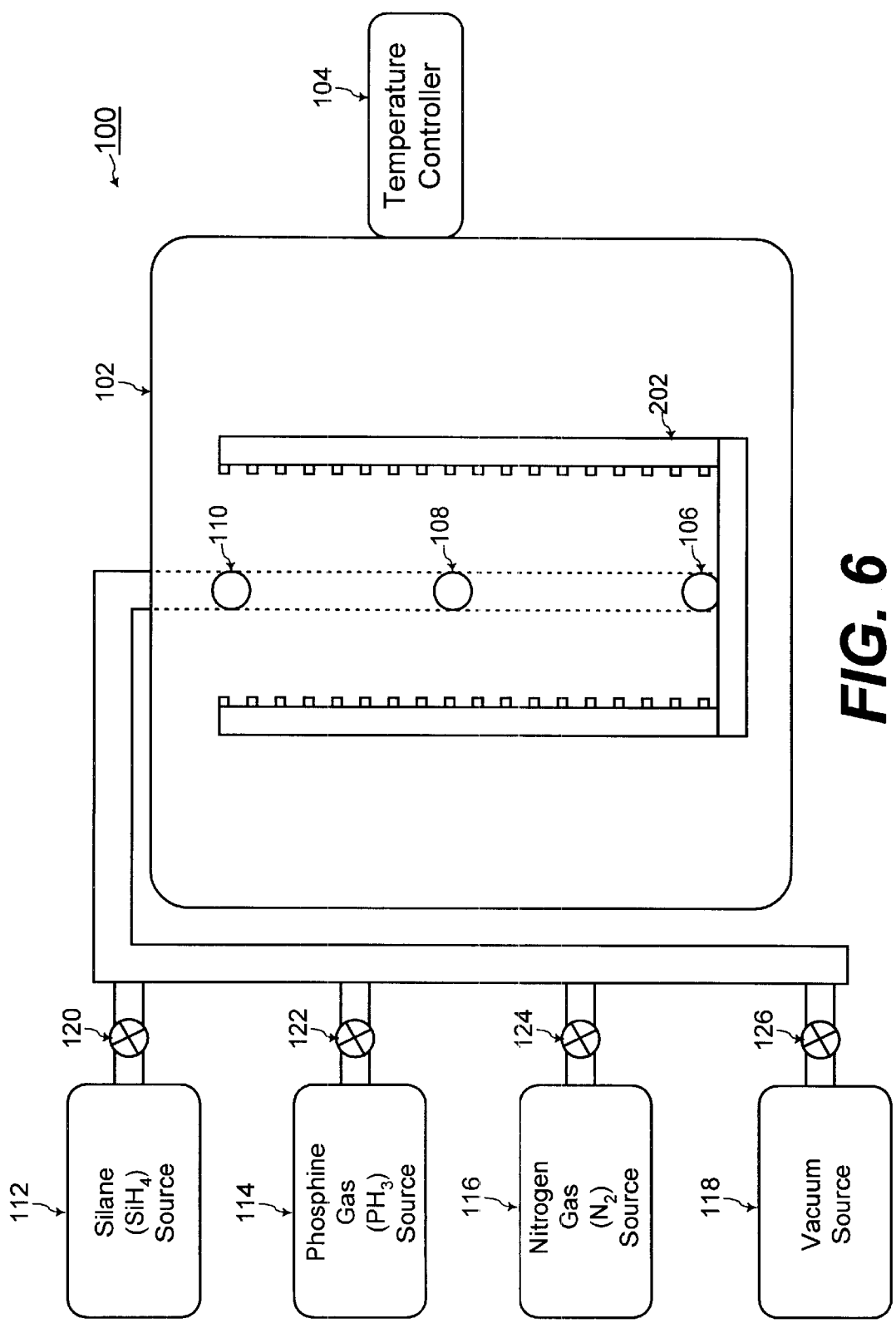
FIG. 6 illustrates placement of the empty wafer boat of FIG. 2 within the reaction chamber of FIG. 1 for deposition of a thick coating of undoped polysilicon film on the empty wafer boat and components of the reaction chamber before deposition of an undoped semiconductor film on a second set of semiconductor wafers, to encapsulate any dopant remaining from the prior deposition of the in-situ doped amorphous semiconductor film on the first set of semiconductor wafers, according to an embodiment of the present invention.

Referring to FIG. 6, the wafer boat 202 that is empty of any semiconductor wafers is then placed back within the reaction chamber 102. After placement of the empty wafer boat 202 within the reaction chamber 102, the valves 124 and 126 are controlled such that a vacuum suction from the vacuum source 118 is applied on the gas inlets 106, 108, and 110 and such that nitrogen gas ($N_2$) is purged through the gas inlets 106, 108, and 110 alternatingly once according to one embodiment of the present invention for reducing the number of contaminant particles within the reaction chamber 102. The valve 120 is then controlled such that the semiconductor reactant source (i.e. silane ($SiH_4$) in FIG. 6) flows through each of the gas inlets 106, 108, and 110. In one embodiment of the present invention, silane flows through each of the gas inlets 106, 108, and 110 with a flow rate of 99 sccm (standard cubic centimeters per minute). The valve 122 is controlled to be shut off such that phosphine substantially does not flow through each of the gas inlets 106, 108, and 110.

The temperature within the reaction chamber 102 is controlled to be set at a predetermined temperature in a range of from about 600° Celsius to about 650° Celsius (preferably about 630° Celsius according to one embodiment of the present invention) by the temperature controller 104. The pressure within the reaction chamber 102 is controlled to be about 0.19 Torr (preferably about 0.194 Torr according to one embodiment of the present invention) by mechanisms that are known in to one of ordinary skill in the art of integrated circuit fabrication.

With such conditions, a layer of undoped polysilicon film is deposited from the semiconductor film reactant (i.e. silane ($SiH_4$) in FIG. 6) on the empty wafer boat 202 and on the components of the reaction chamber 102 (step 308 of FIG. 3). A relatively thick layer of undoped polysilicon film is deposited on the empty wafer boat 202 and on the components of the reaction chamber 102 to encapsulate any phosphorous remaining from the prior deposition of the in-situ doped amorphous silicon film on the first set of semiconductor wafers in FIG. 5. For example, with a deposition time of about 90 minutes, approximately 8,000 Å (angstroms) of undoped polysilicon film is deposited on the empty wafer boat 202 and on the components of the reaction chamber 102 according to one embodiment of the present invention. In another example, with a deposition time of about 140 minutes, approximately 12,000 Å (angstroms) of undoped polysilicon film is deposited on the empty wafer boat 202 and on the components of the reaction chamber 102 according to one embodiment of the present invention. The undoped polysilicon film deposited on the empty wafer boat 202 and on the components of the reaction chamber 102 in FIG. 6 has a thickness in a range of from about approximately 8,000 Å (angstroms) to about approximately 12,000

Å (angstroms), and preferably about 10,000 Å (angstroms) with a deposition time of about 120 minutes.

After deposition of the relatively thick undoped polysilicon film on the empty wafer boat 202 and on the components of the reaction chamber 102, the valve 120 is controlled to be shut off such that silane does not flow through the gas inlets 106, 108, and 110. In addition, the valves 124 and 126 are controlled such that a vacuum suction from the vacuum source 118 is applied on the gas inlets 106, 108, and 110 and such that nitrogen gas ($N_2$) is purged through the gas inlets 106, 108, and 110 alternatingly. Such alternating application of the vacuum suction and the nitrogen gas ($N_2$) purge through the gas inlets 106, 108, and 110 is repeated at least three times for reducing the number of polysilicon particulates within the reaction chamber 102.

Figure 7:
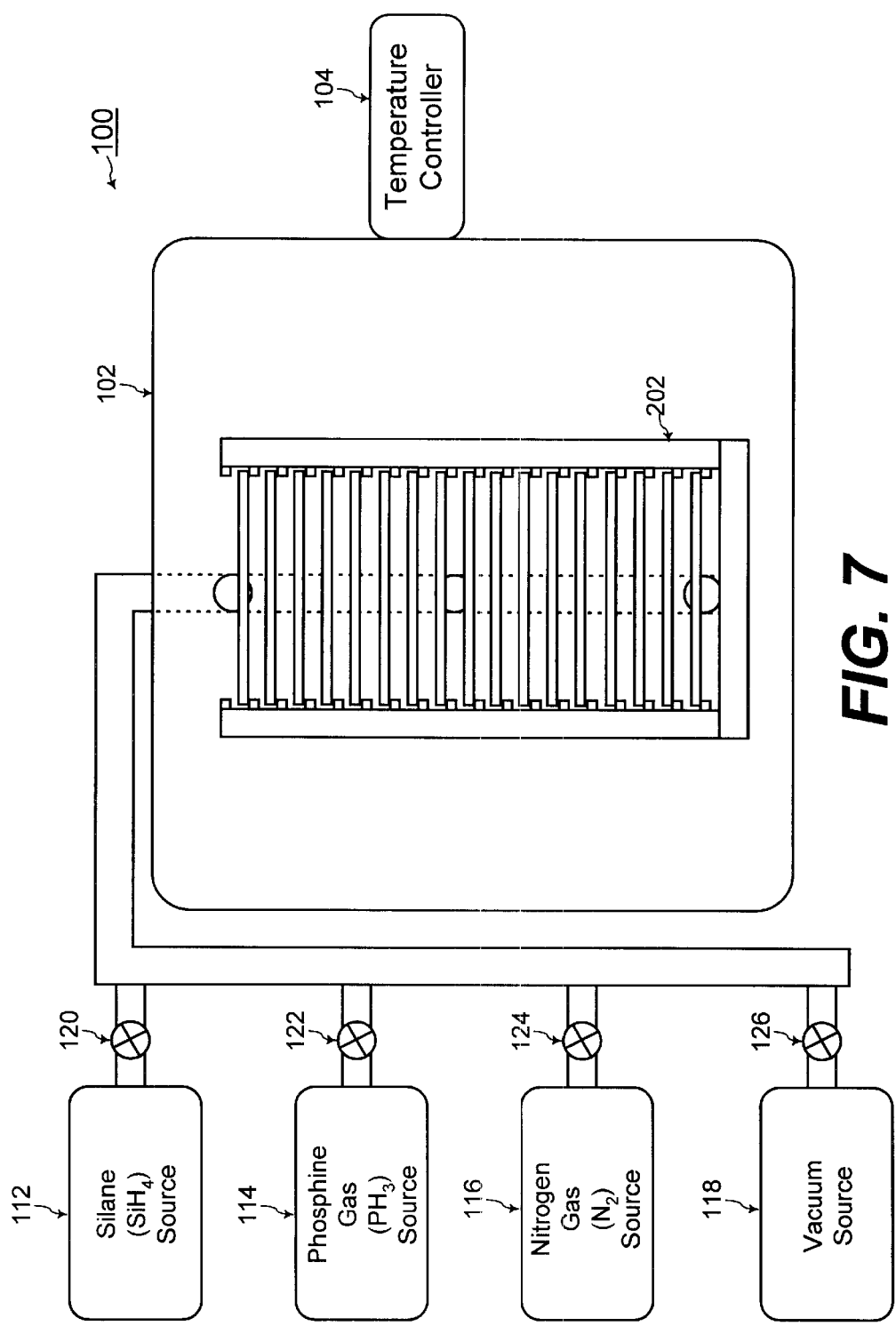
FIG. 7 illustrates placement of the wafer boat of FIG. 2 having a second set of semiconductor wafers loaded therein within the reaction chamber of FIG. 1 for deposition of the undoped semiconductor film on the second set of semiconductor wafers, according to an embodiment of the present invention.

Referring to FIG. 7, for deposition of the undoped semiconductor film on semiconductor wafers, the wafer boat 202 having relatively thick undoped polysilicon film coated thereon is loaded with a second set of semiconductor wafers (step 310 of FIG. 3). Referring to FIG. 7, the wafer boat 202 having the second set of semiconductor wafers loaded therein is then placed into the reaction chamber 102 (step 310 of FIG. 3). The second set of semiconductor wafers are stacked within the wafer boat 202 along the vertical dimension of the linear alignment of the gas inlets 106, 108, and 110 such that the second set of semiconductor wafers are substantially near the gas inlets 106, 108, and 110.

After placement of the wafer boat 202 having the second set of semiconductor wafers loaded therein within the reaction chamber 102, the valves 122, 124, and 126 are controlled to deposit a second undoped polysilicon film on the second set of semiconductor wafers (step 312 of FIG. 3). Processes for deposition of a second undoped polysilicon film on the second set of semiconductor wafers within the reaction chamber 102 for integrate circuit fabrication are known to one of ordinary skill in the art.

In this manner, the relatively thick first undoped polysilicon film encapsulates any dopant remaining from the prior deposition of the in-situ doped amorphous silicon film before the second set of semiconductor wafers are placed into the wafer boat 202 and the reaction chamber 102 for deposition of the second undoped polysilicon film on the second set of semiconductor wafers. The in-situ phosphorous doped amorphous silicon film is deposited on the first set of semiconductor wafers and the undoped polysilicon film is deposited on the second set of semiconductor wafers within the same reaction chamber 102 to minimize cost and labor during integrated circuit manufacture.

The foregoing is by way of example only and is not intended to be limiting. For example, any specified thickness or any specified material of any structure described herein is by way of example only. In addition, the number and positioning of the gas inlets 106, 108, and 110 in FIGS. 1, 4, 5, 6, and 7 are by way of example only, and the present invention may be practiced with any number of gas inlets that are positioned substantially near the semiconductor wafers, as would be apparent to one of ordinary skill in the art of integrated circuit fabrication from the description herein. Also, a wafer boat holding any large number of semiconductor wafers may be placed into the reaction chamber 102 during practice of the present invention. Furthermore, as will be understood by those skilled in the art, the structures described herein may be made or used in the same way regardless of their position and orientation. Accordingly, it is to be understood that terms and phrases used herein refer to relative location and orientation of various portions of the structures with respect to one another, and are not intended to suggest that any particular absolute orientation with respect to external objects is necessary or required.

The present invention is limited only as defined in the following claims and equivalents thereof

We claim:

1. A method for depositing semiconductor films on a plurality of sets of semiconductor wafers, the method including the steps of:

A. placing a first set of semiconductor wafers carried by a wafer boat within a reaction chamber;

B. depositing an in-situ doped amorphous semiconductor film on said first set of semiconductor wafers while said first set of semiconductor wafers carried by said wafer boat is within said reaction chamber;

C. removing said first set of semiconductor wafers carried by said wafer boat from said reaction chamber, and removing said first set of semiconductor wafers from said wafer boat;

D. placing said wafer boat that is empty of any semiconductor wafers within said reaction chamber;

E. depositing a first undoped semiconductor film having a thickness in a range of from about 8,000 Å (angstroms) to about 12,000 Å (angstroms) on said wafer boat and on components of said reaction chamber;

F. removing said wafer boat from said reaction chamber, and loading a second set of semiconductor wafers within said wafer boat;

G. placing said wafer boat having said second set of semiconductor wafers loaded therein within said reaction chamber; and H. depositing a second undoped semiconductor film on said second set of semiconductor wafers while said second set of semiconductor wafers carried by said wafer boat is within said reaction chamber.

2. The method of claim 1, wherein said step B includes the steps of:

setting a pressure within said reaction chamber to be less than approximately 1.0 Torr;

setting a temperature within the reaction chamber to a predetermined temperature in a range of from about 500° Celsius to about 550° Celsius; and flowing a semiconductor film reactant and a dopant reactant into said reaction chamber through at least two gas inlets, each gas inlet being disposed on a respective location of said reaction chamber near said semiconductor wafers within said wafer boat, and each gas inlet carrying both of said semiconductor film reactant and said dopant reactant;

wherein said doped amorphous semiconductor film is deposited from said semiconductor film reactant with in-situ doping from said dopant reactant on said first set of semiconductor wafers in a LPCVD (Low Pressure Chemical Vapor Deposition) process within said reaction chamber.

3. The method of claim 2, wherein a doped amorphous silicon film is deposited with said semiconductor film reactant being comprised of silane ($SiH_4$), and wherein said dopant reactant is comprised of phosphine ($PH_3$) for in-situ doping of phosphorous in said amorphous silicon film.

4. The method of claim 3, wherein said semiconductor film reactant and said dopant reactant are flown into said reaction chamber through a first gas inlet with a flow rate of 2 sccm (standard cubic centimeters per minute) of phosphine and a flow rate of 2000 sccm (standard cubic centimeters per minute) of silane, through a second gas inlet with a flow rate of 2.8 sccm (standard cubic centimeters per minute) of phosphine and a flow rate of 2000 sccm (standard cubic centimeters per minute) of silane, and through a third gas inlet with a flow rate of 20 sccm (standard cubic centimeters per minute) of phosphine and a flow rate of 2000 sccm (standard cubic centimeters per minute) of silane.

5. The method of claim 3, wherein said doped amorphous silicon film with said in-situ phosphorous doping is deposited to have a thickness of about 900 Å (angstroms) with a deposition time of about 9 minutes.

6. The method of claim 1, wherein said step E includes the steps of:

setting a pressure within said reaction chamber to be about 0.19 Torr;

setting a temperature within the reaction chamber to a predetermined temperature in a range of from about 600° Celsius to about 650° Celsius; and flowing a semiconductor film reactant through at least two gas inlets, each gas inlet being disposed on a respective location of said reaction chamber near said wafer boat, and each gas inlet carrying said semiconductor film reactant;

wherein said first undoped semiconductor film is deposited on said wafer boat and said components of said reaction chamber from said semiconductor film reactant in a LPCVD (Low Pressure Chemical Vapor Deposition) process within said reaction chamber.

7. The method of claim 6, wherein said first undoped semiconductor film comprised of undoped polysilicon is deposited with said semiconductor film reactant being comprised of silane ($SiH_4$).

8. The method of claim 7, wherein said semiconductor film reactant of silane ($SiH_4$) flows into said reaction chamber through a first gas inlet with a flow rate of 99 sccm (standard cubic centimeters per minute), through a second gas inlet with a flow rate of 99 sccm (standard cubic centimeters per minute), and through a third gas inlet with a flow rate of 99 sccm (standard cubic centimeters per minute).

9. The method of claim 7, wherein said undoped polysilicon film is deposited to have a thickness in a range of from about 8,000 Å (angstroms) with a deposition time of about 90 minutes, to about 12,000 Å (angstroms) with a deposition time of about 140 minutes.

10. The method of claim 6, further including the steps of:

applying a vacuum suction through said at least two gas inlets before said step of flowing said semiconductor film reactant through said at least two gas inlets; and purging nitrogen ($N_2$) gas through said at least two gas inlets before said step of flowing said semiconductor film reactant through said at least two gas inlets.

11. The method of claim 6, further including the steps of:

applying a vacuum suction through said at least two gas inlets after said step E of depositing said first undoped semiconductor film on said wafer boat and on said components of said reaction chamber;

purging nitrogen ($N_2$) gas through said at least two gas inlets after said step E of depositing said first undoped semiconductor film on said wafer boat and on said components of said reaction chamber;

repeating said steps of applying said vacuum suction and purging nitrogen ($N_2$) gas through said at least two gas inlets at least three times after said step E of depositing said first undoped semiconductor film on said wafer boat and on said components of said reaction chamber.

12. The method of claim 6, wherein said wafer boat holds said second set of semiconductor wafers in a stacked configuration along a vertical dimension of said reaction chamber, and wherein said at least two gas inlets are arranged linearly along said vertical dimension of said reaction chamber near said stacked configuration of said second set of semiconductor wafers.

* * * * *